US011362140B2

(12) United States Patent
Majhi et al.

(10) Patent No.: US 11,362,140 B2
(45) Date of Patent: Jun. 14, 2022

(54) WORD LINE WITH AIR-GAP FOR NON-VOLATILE MEMORIES

(71) Applicant: Intel Corporation, Santa Clara, CA (US)

(72) Inventors: Prashant Majhi, San Jose, CA (US); Brian Doyle, Portland, OR (US); Ravi Pillarisetty, Portland, OR (US); Abhishek Sharma, Hillsboro, OR (US); Elijah V. Karpov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 837 days.

(21) Appl. No.: 16/024,199

(22) Filed: Jun. 29, 2018

(65) Prior Publication Data

US 2020/0006433 A1  Jan. 2, 2020

(51) Int. Cl.
| H01L 27/24 | (2006.01) |
| G11C 7/18 | (2006.01) |
| G11C 8/14 | (2006.01) |
| H01L 27/11597 | (2017.01) |
| G11C 13/00 | (2006.01) |
| G11C 11/22 | (2006.01) |
| H01L 45/00 | (2006.01) |
| H01L 29/78 | (2006.01) |

(52) U.S. Cl.
CPC ............ *H01L 27/2481* (2013.01); *G11C 7/18* (2013.01); *G11C 8/14* (2013.01); *G11C 11/223* (2013.01); *G11C 13/0026* (2013.01); *G11C 13/0028* (2013.01); *H01L 27/11597* (2013.01); *H01L 29/78391* (2014.09); *H01L 45/146* (2013.01); *G11C 2213/71* (2013.01)

(58) Field of Classification Search
CPC .......... H01L 27/2481; H01L 27/11597; H01L 27/2409; H01L 45/04; H01L 45/146; G11C 2213/76
See application file for complete search history.

(56) References Cited

U.S. PATENT DOCUMENTS

| 8,658,499 B2 * | 2/2014 | Makala ............... H01L 29/7926 438/264 |
| 9,905,575 B2 | 2/2018 | Lee |
| 9,911,790 B1 * | 3/2018 | Shimabukuro ....... H01L 45/147 |
| 9,941,299 B1 * | 4/2018 | Chen ................ H01L 27/11595 |
| 2016/0293839 A1 * | 10/2016 | Suzuki ............... H01L 45/1226 |
| 2018/0211703 A1 * | 7/2018 | Choi .................... G11C 13/003 |

* cited by examiner

*Primary Examiner* — Allison Bernstein
(74) *Attorney, Agent, or Firm* — Schwabe, Williamson & Wyatt P.C.

(57) ABSTRACT

Integrated circuits including 3D memory structures are disclosed. Air-gaps are purposefully introduced between word lines. The word lines may be horizontal or vertical.

20 Claims, 14 Drawing Sheets

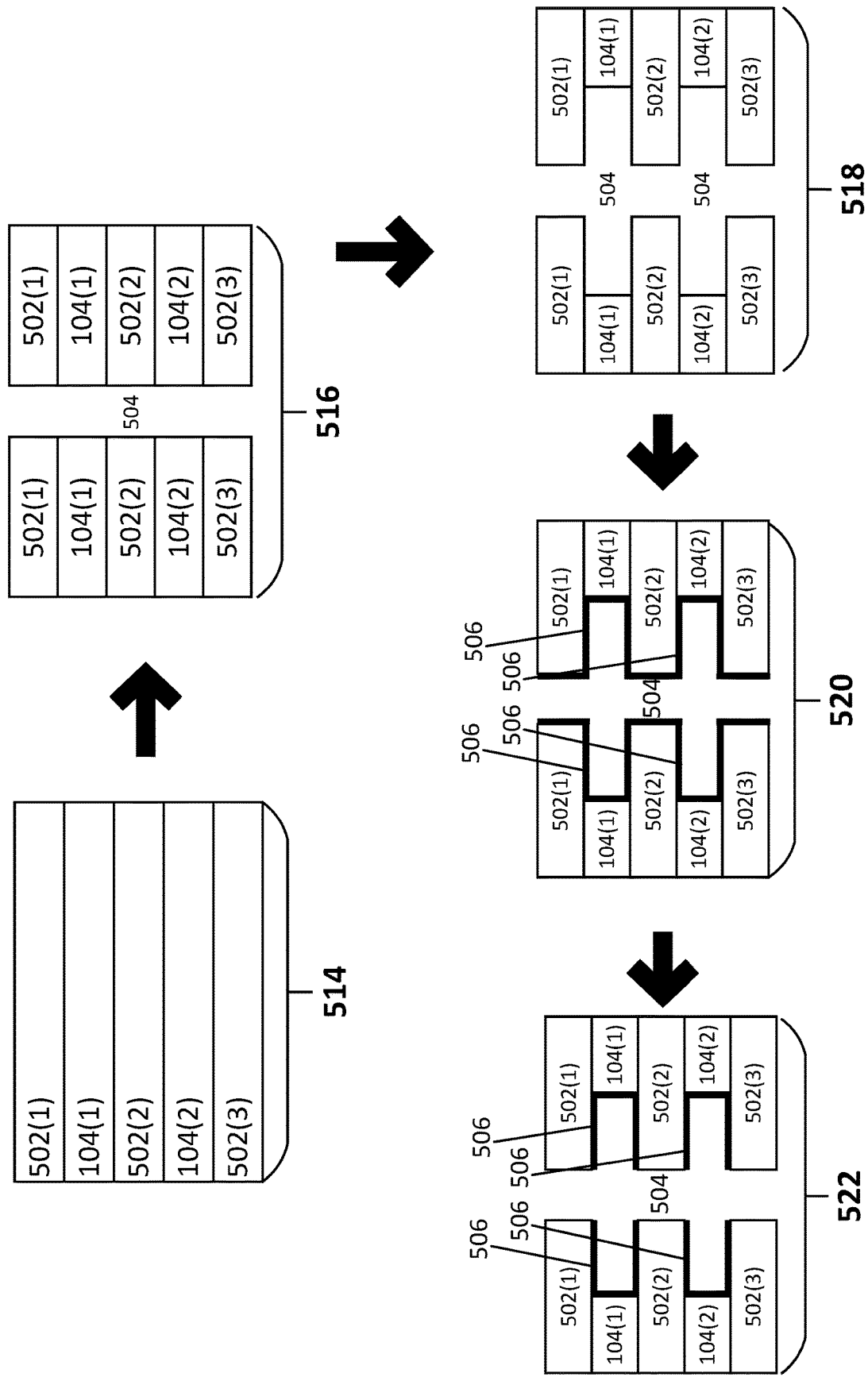

WORD LINE WITH AIR-GAP FOR NON-VOLATILE MEMORIES

BACKGROUND 3D eNVM ("embedded Non-Volatile Memory") integrated on backend is increasingly important as NVM is scaled for cost and performance. Among various next-generation NVMs, Resistive Random Access Memory ("RRAM") is a promising candidate for future memory due to its high-efficiency, high-speed and energy-saving characteristics. RRAM technology utilizes a so-called memristor, which has a resistance that varies with respect to the voltage drop across it. Another NVM is FeFET ("Ferroelectric Field-Effect Transistors") based memory. In FeFET memory, there is a memory cell in which a ferroelectric replaces the gate dielectric of a complementary metal oxide semiconductor (CMOS) transistor. These NVMs can be arranged in a stacked configuration, or so-called three-dimensional (3D) architecture. There are a number on non-trivial issues associated with such stacked memory architectures.

BRIEF DESCRIPTION OF THE DRAWINGS

FIG. 5a depicts a first portion of a process flow for forming one or more air-gaps between horizontal word lines arranged in a 3D memory structure according to one embodiment of the present disclosure.

DETAILED DESCRIPTION

As previously explained, there are a number on non-trivial issues associated with such stacked 3D memory architectures, particularly as scaling and densification continue to trend toward smaller and denser structures. One possible solution to reduce bit cost for 3D architectures (such as FeFET and RRAM) might be to use large word line area (common to several bit lines), that are stacked (vertically or horizontally). However, such an architecture may result in significant parasitic capacitance as the word line spacing is scaled, and this parasitic capacitance can in turn cause increasing delay (e.g., RC-based delay) as well as yield loss (e.g., current overshoot from parasitic discharge). To this end, some solutions may focus on limiting the size of the sub-arrays and/or reducing the integrated dielectric constant k value of the dielectric material between the word lines. Unfortunately, such solutions effectively compromise on the bit cost scalability of the architecture, as smaller sub-arrays limit the cost scaling. Also, note that the parasitic capacitance may still be high enough to cause significant overshoot currents and limit RC delay and/or other issues.

Thus, and according to one embodiment of the present disclosure, parasitic capacitance in large word line 3D stacked memory arrays is reduced by incorporating air-gaps between stacked word lines. As air has the lowest dielectric constant ($\kappa$) incorporating air-gaps between the word lines results in improved bandwidth due to lowering of the resistance-capacitance (RC) constant. In addition, the use of air-gaps results in low parasitic discharge (improved reliability), and is backend compatible. In addition, relaxed selector/RRAM is of lower cost (standard thin film process). The techniques may be utilized in the context of any number of 3D stacked memory architectures where a relatively large word line can be employed, and in memory architectures having vertical word lines as well as memory architectures having horizontal word lines.

Figure 1:
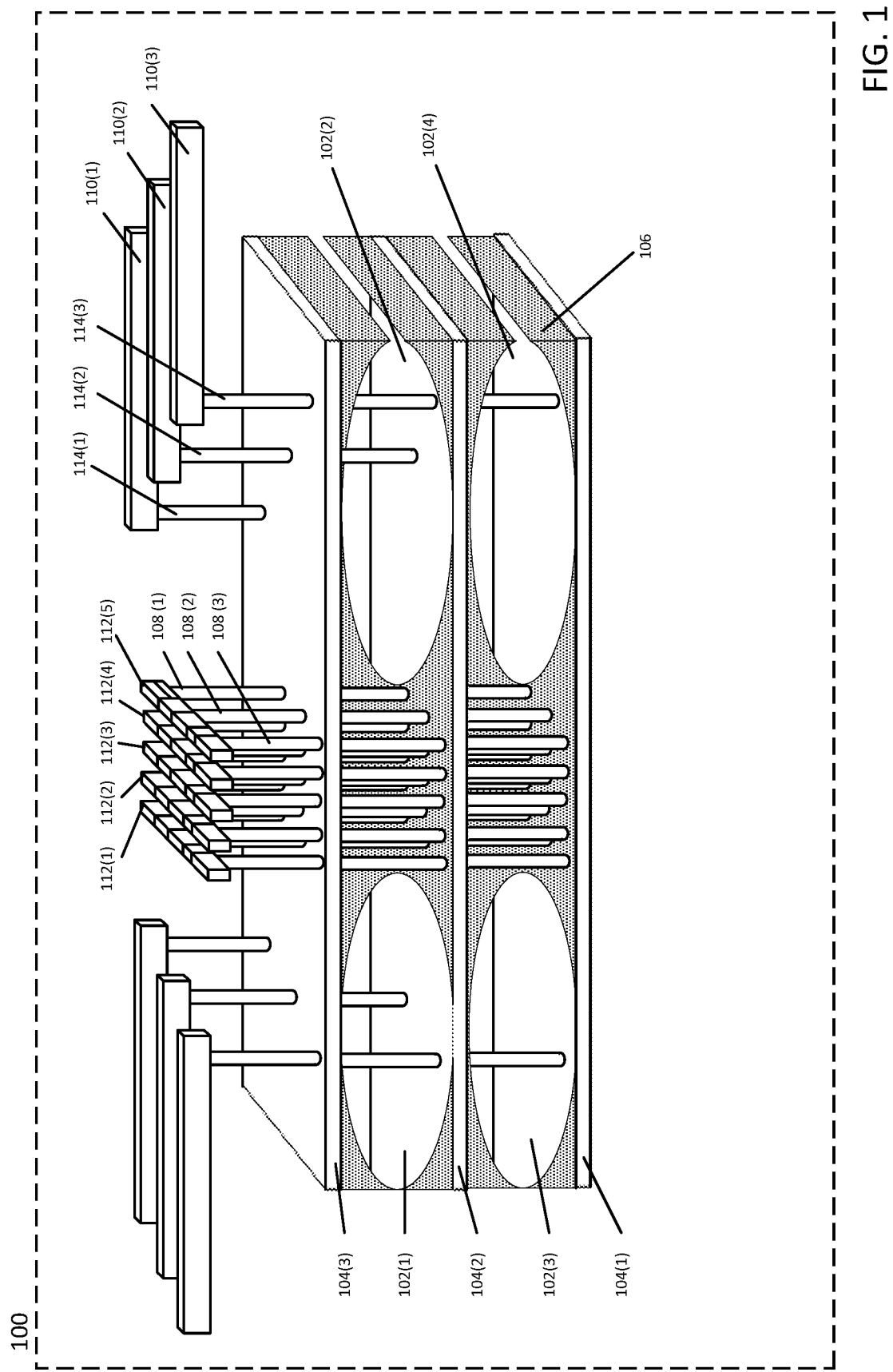
FIG. 1 depicts a 3D memory structure with air-gaps between horizontal stacked large area word lines according to one embodiment of the present disclosure.

FIG. 1 depicts a 3D memory structure with air-gaps between horizontal stacked large area word lines according to one embodiment of the present disclosure. In some example embodiments, the 3D memory structure 100 may utilize either a FeFET or RRAM structure for the storage of information, although other 3D stacked memory structures may be used as well, as will be appreciated. As will be further appreciated, structure 100 generally includes a plurality of memory cells arranged in an array. Each memory cell may be addressed via a WL corresponding to the row of the memory cell and a bit line ("BL") corresponding to the column of the memory cell. That is, the intersection of a BL and WL constitutes the address of the memory cell. As will be described in more detail herein, according to one embodiment, memory structure 100 includes word lines (WLs) that are parallel to one another and parallel to the wafer surface (e.g., horizontal WLs). According to an alternative embodiment, structure 100 includes WLs that are parallel to one another but perpendicular to the wafer surface (e.g., vertical WLs).

Referring now to FIG. 1, 3D memory structure 100 includes WLs 104(1)-104(3), BLs 108(1)-108(3), BL group select contacts 112(1)-112(5), and WL group select contacts 110(1)-110(3). The function of BL group select contacts 112(1)-112(3) and WL group select contacts 110(1)-110(3)

will be described in detail with respect to FIG. 2. For purposes of the present discussion, it is sufficient to understand that BL group select contacts 112(1)-112(3) and WL group select contacts 110(1)-110(3) operate to facilitate addressing individual BLs 108 and WLs 104 in a space-efficient manner. Further, note that structure 100 shown in FIG. 1 shows only a small portion of such a structure with an arbitrary number of WLs 104 and BLs 108 as well as WL group select contacts 110 and BL group select contacts 112. It will be appreciated that in general, a 3D structure 100 may contain any number of the aforementioned elements and structures in an arbitrary arrangement.

As shown in FIG. 1, WLs 104(1)-104(3) are arranged in a stacked configuration whereby one or more air-gaps 102 (1)-102(4) have been introduced between WLs to reduce the parasitic capacitances between WLs 104. For example, as shown in FIG. 1, air-gaps 102(1)-102(2) have been introduced between WLs 104(2)-104(3). Similarly, air-gaps 102 (3)-102(4) have been introduced between WLs 104(1)-104 (2). Example methodologies for fabrication of an air-gap 102 between WLs 104 will be described in turn. Further, as shown in FIG. 1, low resistance contacts 114(1)-114(3) are electrically coupled to associated WLs 104(1)-104(3) and provide a low resistance/high conductance path for access to these respective WLs 104.

Although FIG. 1 shows two air-gaps (e.g., 102(3)-103(4)) between each pair of WLs (e.g., 104(1)-104(2)), it will be understood that any number of air-gaps 102 may be introduced between stacked WLs 104. In addition, it will be understood that said air-gaps can take any shape or size, and need not be symmetrical from one air-gap to the next.

Air-Gap Capacitance Reduction

The capacitance of parallel, flat metallic plates of area A and separation d can be shown as:

$$C = \frac{\kappa \epsilon_0 A}{d}$$

where $\epsilon_0 = 8.8854 \times 10^{-12}$ F/m (Farads/meter) is the permittivity of free space, $\kappa$ is the relative permittivity (also known as the dielectric constant) of the dielectric material between the plates, A is the area of the plates, and d is the separation distance of the plates. This expression can be derived by considering the general expression for a linear capacitance $$C = \frac{Q}{V}.$$

Thus, the capacitance (C) is inversely proportional to the plate separation and directly proportional to the relative permittivity. Thereby, reducing $\kappa$ will induce a lower capacitance between a parallel plate capacitor. The lowest possible permittivity is that of a vacuum. Vacuum permittivity, sometimes called the electric constant, is represented by $\epsilon_0$ (i.e., $8.8854 \times 10^{-12}$ F/m). By definition, a perfect vacuum has a relative permittivity of exactly 1 and the difference in permittivity between vacuum and air can be considered negligible. $\kappa_{air} \approx 1.0006$. Thus, utilizing air as a dielectric will result in the lowest possible capacitance for all practical purposes, although airgaps with other gas may be used as well, as will be appreciated.

Figure 2:
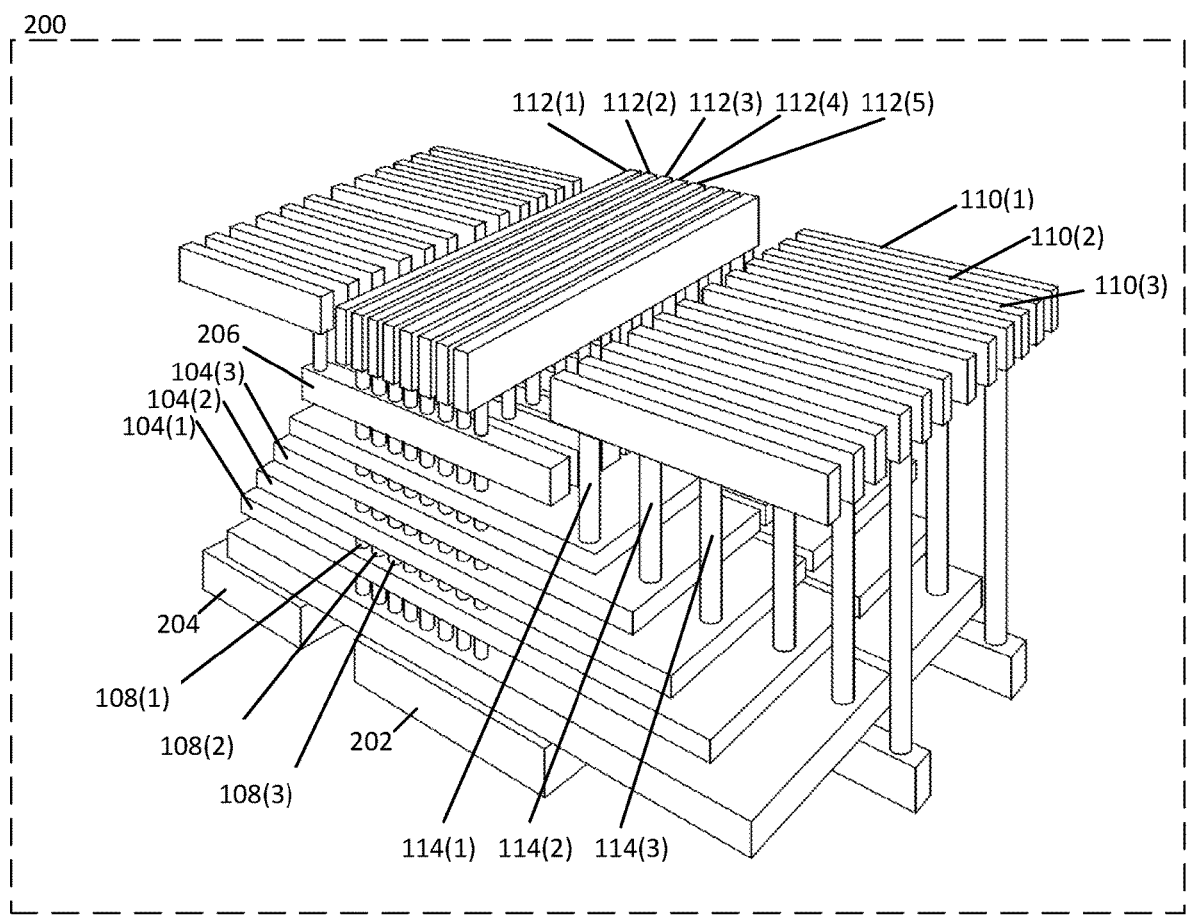
FIG. 2 depicts a 3D FeFET/RRAM with air-gaps between horizontal stacked large area word lines according to one embodiment of the present disclosure.

FIG. 2 depicts a 3D FeFET/RRAM with air-gaps between horizontal stacked large area word lines according to one embodiment of the present disclosure. In general, a read or write operation may be performed on 3D FeFET/RRAM structure 200 with respect to desired memory cells. For purposes of the present discussion, the term "programming" is used herein to refer to writing to a particular memory cell or set of cells. As will be appreciated, structure 200 is configured to facilitate the addressing of desired memory cells while suppressing the addressing of undesired memory cells with respect to a particular read/write operation.

As shown in FIG. 2, structure 200 comprises WLs 104 (1)-104(3), BLs 108(1)-108(3), upper select-gate ("SG") 206, lower SG 204, source line 202, BL group select contacts 112(1)-112(5), WL group select contacts 110(1)-110(3), and low resistance WL contacts 114(1)-114(3). As will be appreciated in light of this disclosure, air-gaps may be introduced between WLs 104(1)-104(3) to reduce the capacitance between WLs 104 and improve the performance of structure 200. Note that only a portion of WLs 104, BLs 108 and other structures are labeled in FIG. 2. Furthermore, it will be understood that FIG. 2 only shows a portion of a 3D FeFET/RRAM structure 200, and that structure 200 may include any number of WLs 104, BLs 108 and other memory structure elements.

WLs 104(1)-104(3) provide gate control to the memory cells and can operate to either read or write (program) the memory state of the respective memory cells to which they are electrically coupled. As previously described, structure 200 may incorporate either RRAM or FeFET structures as memory cells, according to some embodiments. BLs 108 operate to address a particular bit within a word associated with a WL 104.

Each of upper SG 206 operates to activate a group of BLs 108 that are to be programmed and deactivate a group of BLs 108 that are not to be programmed. According to one embodiment of the present disclosure, each upper SG 206 may include a gate region of a CMOS transistor. Lower SG 204 performs a similar function as to upper SG 206 in selecting a set of BLs 108. According to one embodiment, upper SG 206 and lower SG 204 may operate in tandem. Source line 202 provides a common source contact for upper SG 206 and/or lower SG 204, which may include CMOS transistors.

BL group select contacts 112 operate to select a group of BLs 108. The purpose of BL group select contacts 112 is to provide a space efficient mechanism for addressing BLs 108. Note that BL group select contacts 112 and upper SG 206 run in orthogonal directions. Thus, by selecting a particular BL group select contact 112 and an upper SG 206, only a single BL 108 is selected. WL group select contacts 110 and low resistance WL contacts 114 provide a similar function with respect to WLs 104.

3D RRAM Memory Cell

Figure 3A:
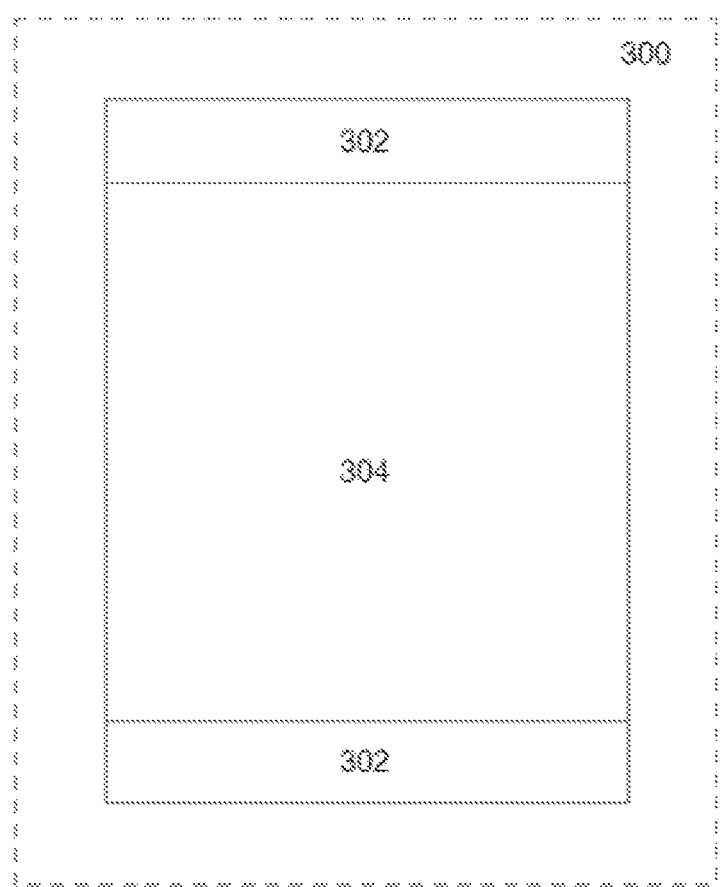
FIG. 3a depicts an example RRAM memory cell.

FIG. 3a depicts an example RRAM memory cell. As can be seen, RRAM memory cell 300 comprises metal layers 302 and switching layer 304. As will become evident as the operation of RRAM memory cell 300 is further described, the resistive state of switching layer 304 may be set to exhibit a non-volatile high resistance state ("HRS") or low resistance state ("LRS") via the formation of a conductive filament. The HRS may be used to symbolize a digital 1 and the LRS a digital 0 or vice-versa.

Figure 3B:
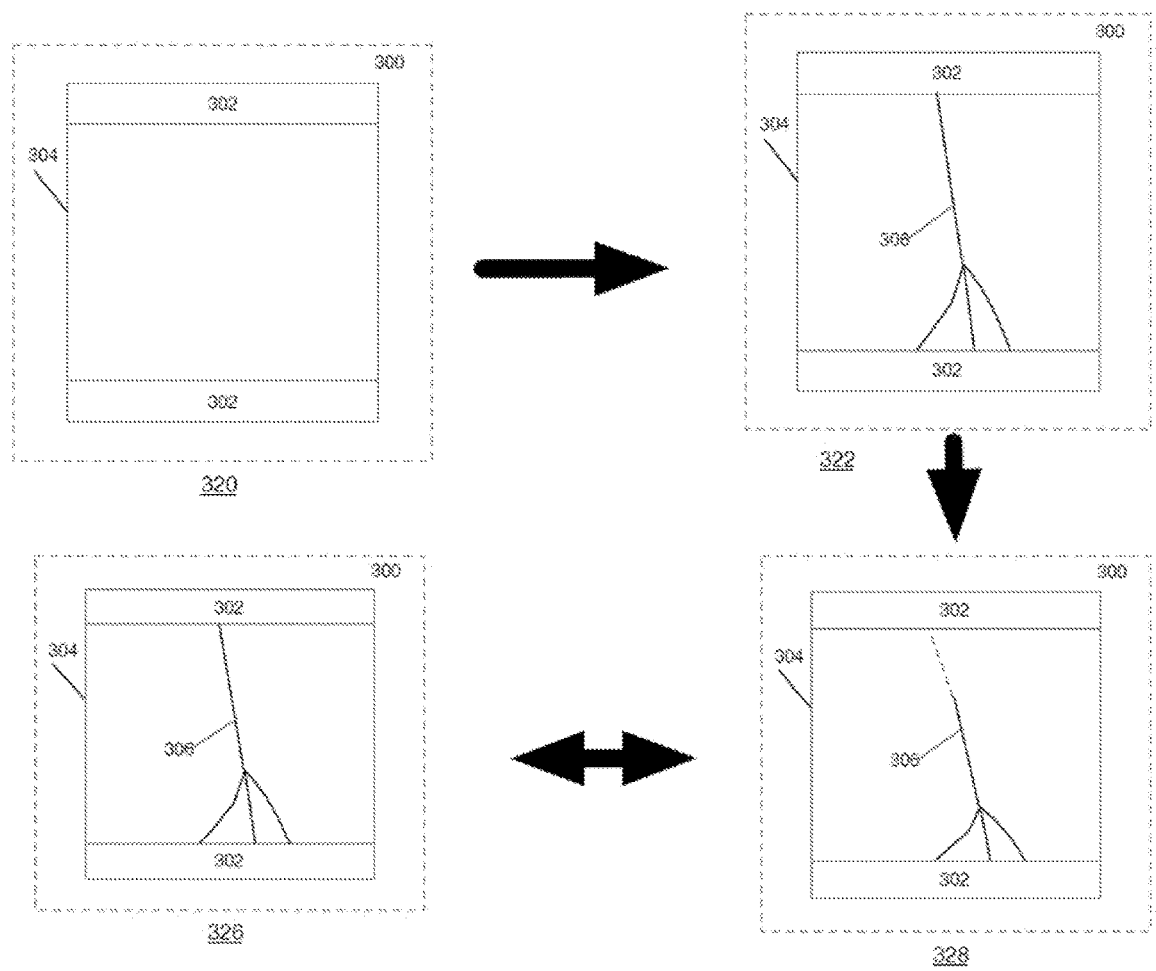
FIG. 3b depicts an example switching operation of an RRAM memory cell.

FIG. 3b depicts an example switching operation of an RRAM memory cell. In particular, in 320, an as-prepared RRAM memory cell 300 is in a HRS. During the 'forming' process 322, conducting paths 306 (e.g., filaments) form in switching layer 304 by applying a high voltage stress as a soft breakdown, and RRAM memory cell 300 is switched into an LRS. In 328, RRAM memory cell 300 in an LRS is switched to an HRS by applying a 'reset voltage' (reset state). A set state 326 is characterized by the persistent presence of conducting path 306 as compared with the reset state 328 in which the conducting path is removed.

Figure 3C:
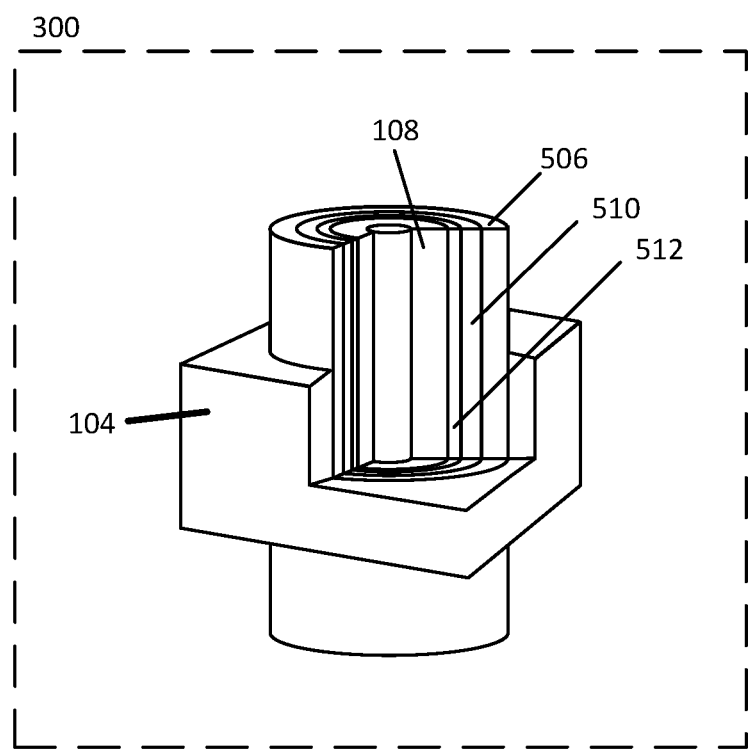
FIG. 3c depicts a cross-section of an example 3D RRAM memory cell for integration into in a 3D memory structure that can be implemented in conjunction with word line air-gaps, according to one embodiment of the present disclosure.

FIG. 3c depicts a cross-section of an example 3D RRAM memory cell for integration into in a 3D memory structure that can be implemented in conjunction with word line air-gaps, according to one embodiment of the present disclosure. As can be seen, RRAM memory cell 300 further comprises WL 104, BL 108, selector 506, metal electrode 510 and RRAM 510. RRAM 510 corresponds to switching layer 304 shown in FIGS. 3a-3b. Typically, selector 506 and RRAM 510 are incompatible. Thus, metal electrode 510 may be utilized to separate selector 506 from RRAM 510. Example materials for each of these elements is described below. The operation of RRAM memory cell 300 will now be described.

In order to set the state (i.e., digital 1) of 3D RRAM memory cell 300, a positive voltage is applied to WL 104. Conversely, to reset (i.e., digital 0) the state of 3D RRAM memory cell 300, a negative voltage is applied to WL 104. RRAM 510 operates as a switching layer 304. Selector 506 operates to introduce a threshold voltage required to set or reset RRAM 3D memory cell 300. In particular, upon application of a voltage to WL 104, due to electrical coupling to other memory cells, a voltage differential will be introduced across memory cells other than the desired cell to be addressed (however these voltages will typically be less than the required threshold voltage to set or reset the memory cell due to resistive loss). In order to prevent the spurious setting or resetting of other memory cells, selector 506 introduces a threshold voltage required to set or reset RRAM memory cell 300.

Example Materials for 3D RRAM

According to one embodiment of the present disclosure, the following example materials may be utilized for the 3D RRAM:

WL 104 and BL 108: titanium nitride (TiN), tungsten (W), tantalum nitride (TaN), and ruthenium (Ru);

Selector 506: silicon dioxide ($SiO_2$), niobium oxide ($NbO_2$), germanium telluride (GeTe), and silicon (Si); and RRAM 510 (switching layer memory): hafnium oxide ($HfO_2$), tantalum oxide ($TaO_2$), $SiO_2$, tungsten oxide ($WO_2$), and titanium oxide ($TiO_2$).

3D RRAM Air-Gaps and the Fundamental Functioning of Memory Cell

Resistive switching of RRAM operation employs an oxide to create a local filamentary conduction path that is modulated between ON (continuous filament: low resistance state) and OFF (gap in filament: high resistance state). The switching from OFF to ON state is a threshold event and requires careful control of the current flowing through the oxide memory. If the currents are uncontrolled, the filament that is formed becomes large and difficult to program to its OFF state. While 3D RRAM memory cell 300 has a selector 506 to control the currents that flow through the oxide memory (RRAM 510), the selector 506 is often not sufficient in terms of controlling instantaneous spike currents during the threshold switching of the memory. The main contributor to the spike currents during the memory switching operation is the capacitance between WLs 104. It is desirable, for instance, to have a parasitic capacitance of less than 50 femtofarads, to minimize the amount and impact of spike currents. In 3D RRAM, given the dimensions and pitch of the WLs 104, it is challenging to design arrays with less than 50 femtofarads of parasitic capacitance with traditional insulators (oxides, nitrides) between the WLs 104. Hence integration of air-gaps 102 between the WLs 104 provide the opportunity to realize functional memory with competitive array density and performance.

Ferroelectric Memory Cell

Figure 4A:
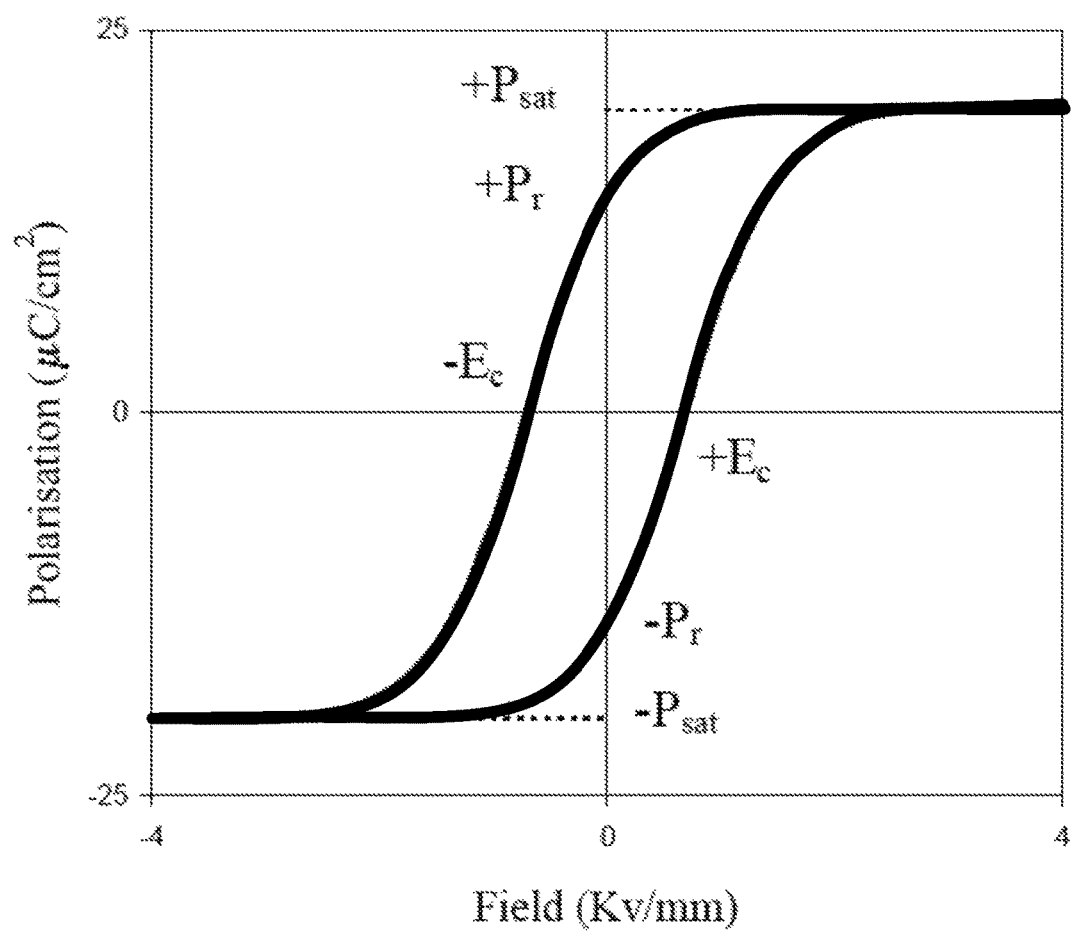
FIG. 4a is a plot of a P-E hysteresis loop parameters for a ferroelectric material.
Figure 4B:
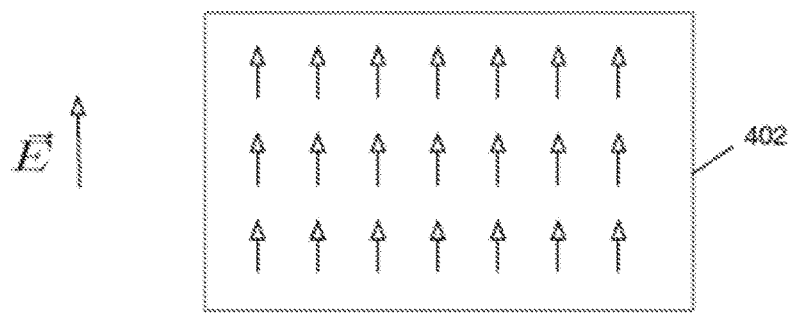
FIG. 4b depicts a polarization of a ferroelectric in a parallel configuration.
Figure 4C:
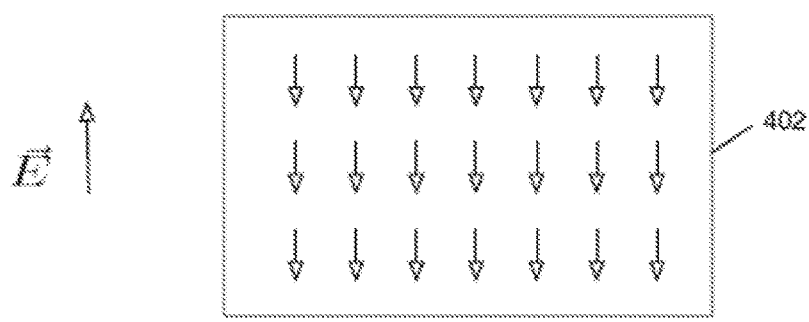
FIG. 4c depicts a polarization of a ferroelectric in an antiparallel configuration.
Figure 4D:
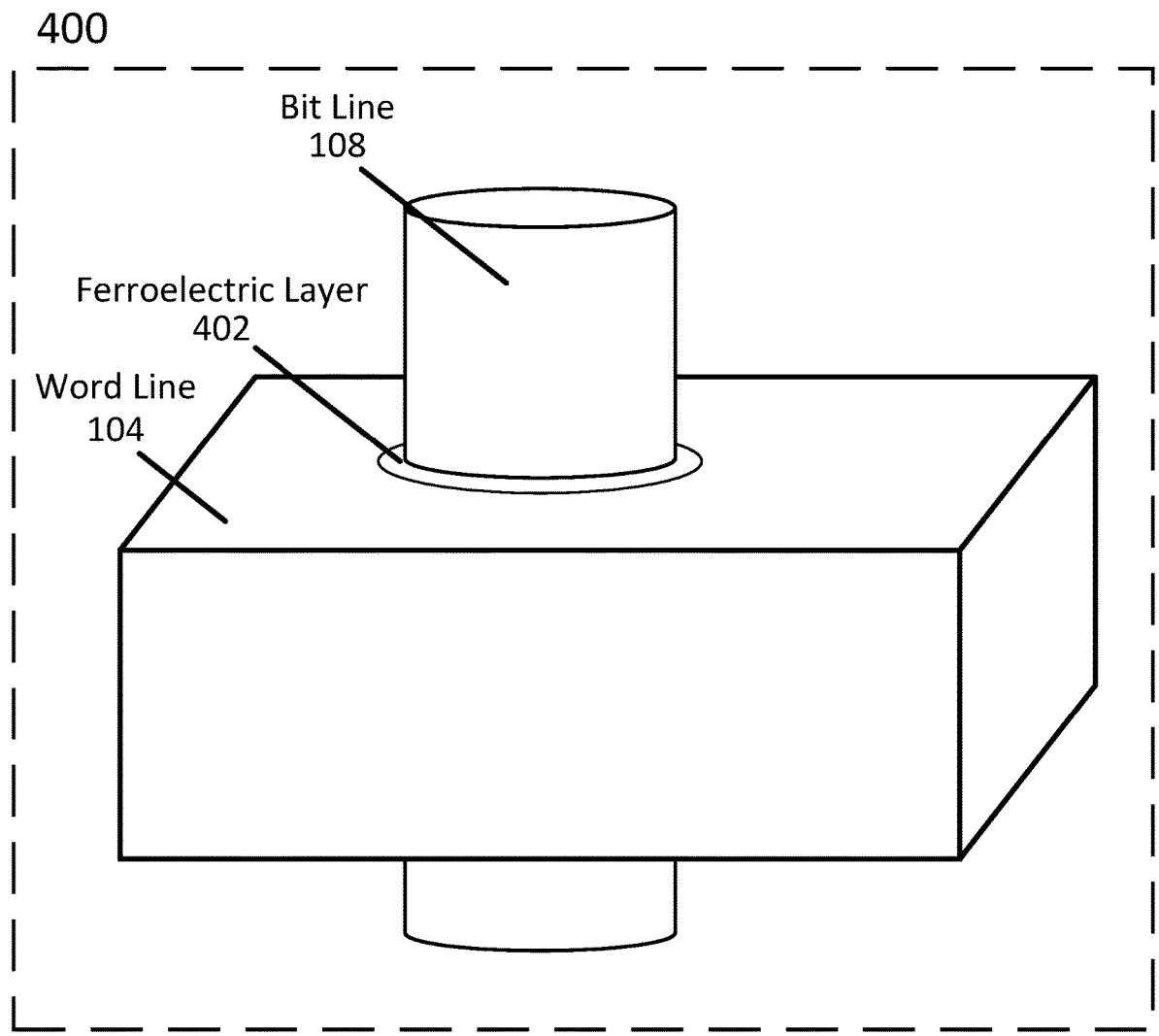
FIG. 4d depicts a cross-section of a 3D FeFET memory cell for integration into in a 3D memory structure that can be implemented in conjunction with word line air-gaps, according to one embodiment of the present disclosure.

According to an alternative embodiment of the present disclosure, 3D FeFET/RRAM may utilize a FeFET as a memory cell. In general, a ferroelectric material has two distinct polarization states that can be switched with the application of an electric field, and further either polarization state can be persisted in the absence of the electric field. As will be appreciated, hysteresis qualities prevent chatter at the switching threshold, as illustrated by FIG. 4a. FIG. 4b depicts a polarization of a ferroelectric in a parallel configuration. As can be seen, polarization of ferroelectric layer 402 is in the same direction (parallel) to the applied electric field $\vec{E}$. A parallel polarization state may be induced in ferroelectric layer 402 by applying a large positive voltage (coercive voltage) across ferroelectric layer 402. FIG. 4c depicts a polarization of a ferroelectric in an antiparallel configuration. As can be seen, polarization of ferroelectric layer 402 is in the opposite direction (antiparallel) of the applied electric field $\vec{E}$. An anti-parallel polarization state may be induced in ferroelectric layer 402 by applying a large negative voltage (coercive voltage) across the ferroelectric layer 402. FIG. 4d depicts a cross-section of a 3D FeFET memory cell for integration into in a 3D memory structure that can be implemented in conjunction with word line air-gaps (between adjacent horizontal word lines or adjacent vertical word lines), according to an embodiment. As can be seen, FeFET memory cell 400 further comprises WL 104, ferroelectric layer 402 and BL 108.

Example Materials for 3D FeFET

According to one embodiment of the present disclosure, the following materials may be utilized for the 3D FeFET:

WL 104: TiN, W, TaN, and Ru;

BL 108: silicon, germanium, and silicon germanium (SiGe); and

Ferroelectric 402: $HfO_2$ (including doped $HfO_2$, example dopants including aluminum, silicon, and yttrium), and hafnium zirconium oxide (HfZrO).

Process Flow for Horizontal Word Line with Air-Gap

FIG. 5a depicts a first portion of a process flow for forming one or more air-gaps between horizontal word lines arranged in a 3D memory structure according to one embodiment of the present disclosure. Although the process flow shown in FIG. 5a shows only a portion of horizontal WLs arranged in a stacked 3D structure, it will be understood that the process may be applied to an arbitrary number of horizontal WLs. Furthermore, the process shown in FIG. 5a corresponds to fabrication of an RRAM memory cell 300. It will be understood that according to alternative embodiments, instead of an RRAM memory cell, a FeFET memory cell 400 or other memory cell may be generated.

Referring now to FIG. 5a, the example horizontal process flow at 514 shows a stack comprising two WLs 104(1)-104(2) disposed between sacrificial isolation layers 502(1)-502(3). According to one embodiment of the present disclosure, sacrificial isolation layers 502(1)-502(3) may be $SiO_2$. At 516, a BL hole 504 is etched through the entire stack. As will be appreciated, a BL will be subsequently formed in BL hole 504. For purposes of the present disclosure, BL hole 504 will refer to etched regions, which may comprise air or vacuum. At 518 of the horizontal process flow, WLs 104(1) and 104(2) are laterally etched and recessed so as to transform them into recessed WLs 104. The etch can be carried out using wet and/or dry etching. In particular, according to one embodiment of the present disclosure, WL etching is carried out via a selective isotropic wet etch scheme that utilizes an etchant having a chemical composition that selectively etches WLs 104(1)-104(2) and does not significantly etch or otherwise impact sacrificial isolation layers 502(1)-502(3). Any number of such selective etch schemes can be used, as will be appreciated.

At 520, selector 506 material is conformally introduced into etched region 504. According to one embodiment of the present disclosure, selector 506 is deposited in a conformal fashion using an atomic layer deposition (ALD) process. Example materials for fabricating selector 506 described herein are equally applicable here. At 522 of the process flow, an etching process is performed to remove selector 506 material from the exposed vertical sides of sacrificial isolation layers 502(1)-502(3). The etch can be any number of wet and/dry etch schemes, but in one embodiment is directional (anisotropic) dry etch.

Figure 5B:
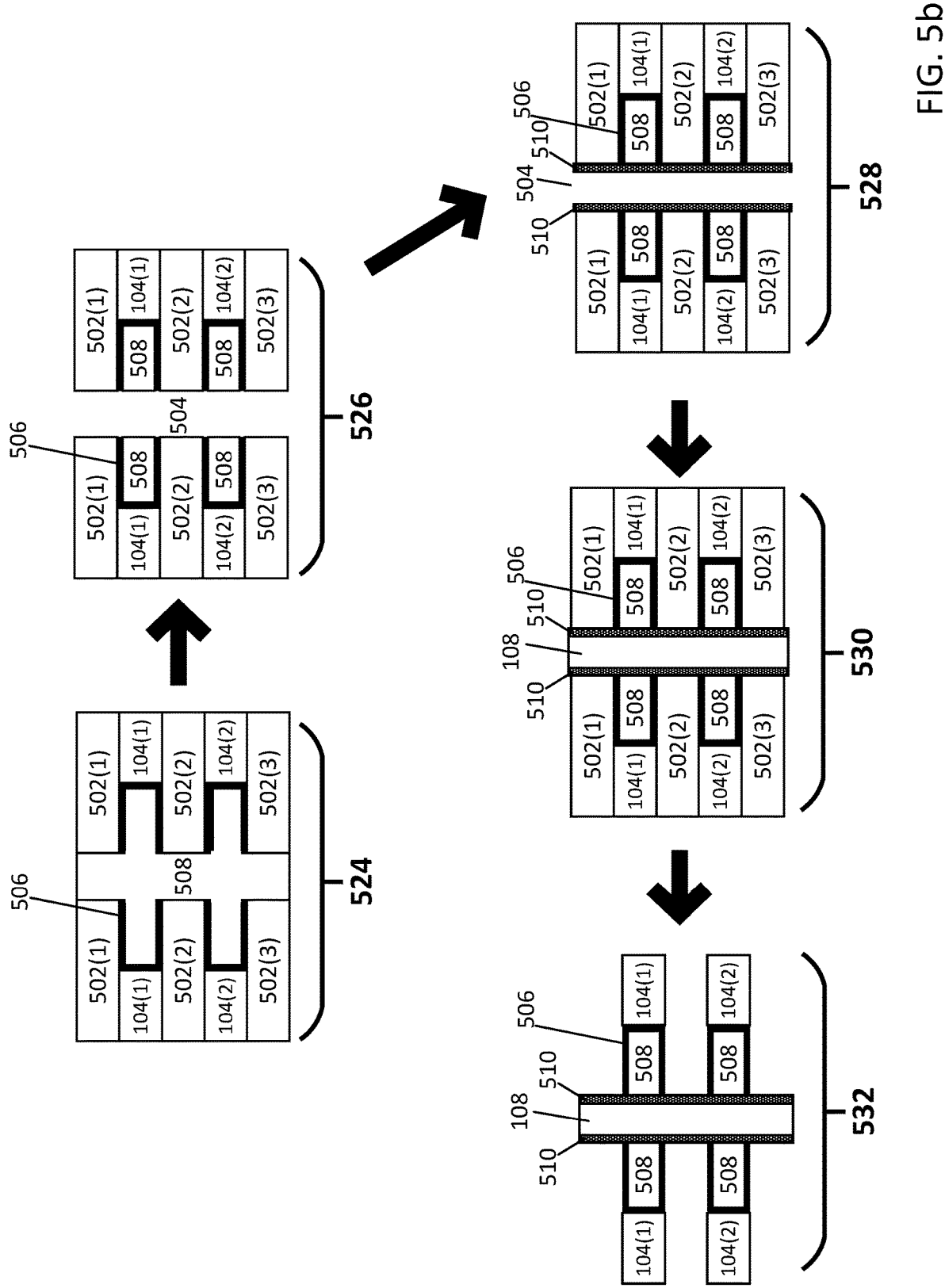
FIG. 5b depicts a second portion of a process flow for forming one or more air-gaps between horizontal word lines arranged in a 3D memory structure according to one embodiment of the present disclosure.

The process flow shown in FIG. 5b continues from the process flow shown in FIG. 5a, according to one embodiment. As can be seen at 524, metal electrode 508 is deposited in the remaining portion of hole 504 using either an ALD or chemical vapor deposition ("CVD") process, for example. In 526, an etching is performed to remove all material not bounded by sacrificial isolation layers 502(1)-502(3) forming hole 504. A directional dry etch can be used according to some embodiments, but in other embodiments any suitable wet and/or dry etch may be used. A directional etch may provide a more vertical etch relative to an isotropic etch, as will be appreciated. At 528, RRAM 510 is conformally deposited on to sidewalls of hole 504. In 530, BL 108 is deposited within the remaining portion of hole 504 (again, ALD or CVD, or other suitable deposition can be used). At 532, sacrificial layers 502(1)-502(3) are removed, which can be done with an etch process that is selective to materials other than the material of sacrificial layers 502(1)-502(3) (i.e., the etch removes the sacrificial layers 502(1)-502(3) at a much higher rate than the other exposed materials).

Figure 5C:
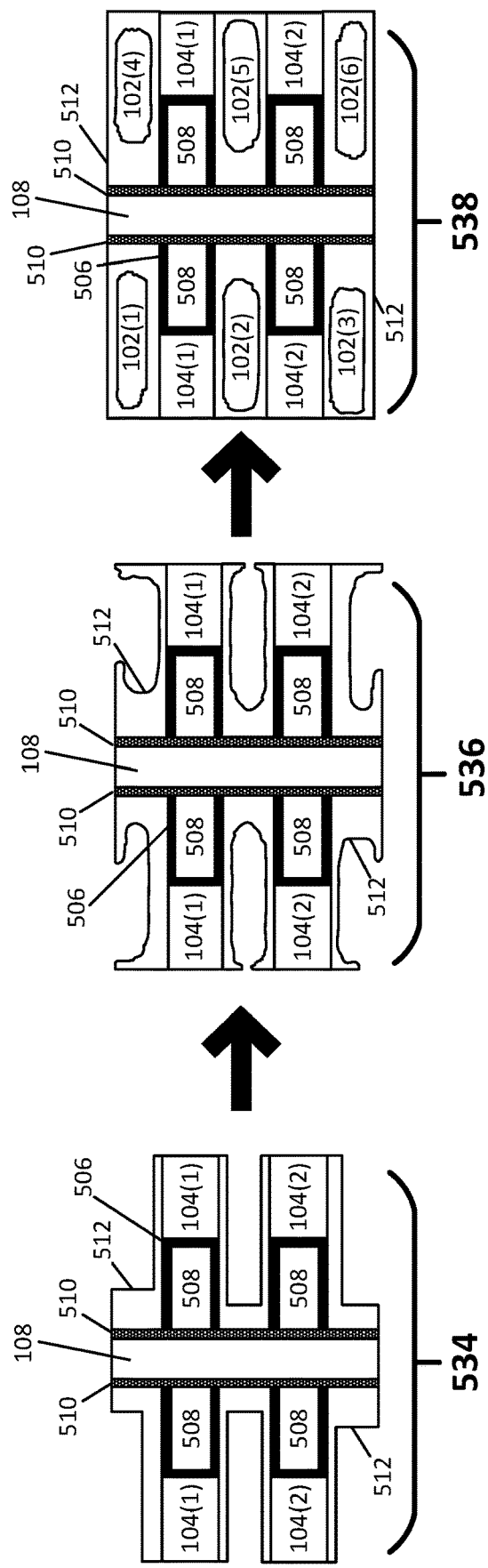
FIG. 5c depicts a third portion of a process flow for forming one or more air-gaps between horizontal word lines arranged in a 3D memory structure according to one embodiment of the present disclosure.

Continuing with the process flow in FIG. 5c at 534, an insulator material/layer 512 is non-conformally deposited, which according to one embodiment may be silicon oxycarbonitride (SiOCN) provided by CVD. Other insulator materials and non-conformal deposition techniques may be used as well, as will be appreciated. This non-conformal deposition continues over a given time period, as shown at 536 and 538. Because of the non-conformal nature of the deposition, the deposited insulator material 512 eventually pinches off on itself before completely filling the voids created at 532, thereby forming air-gaps 102(1)-102(6) as shown at 538. In some such embodiments, note that the deposition process for insulator material 512 includes a combination of etching and depositing non-conformally to create the desired air-gaps 102(1)-102(6). In some case, note that insulator material 512 is deposited as a thin film in a non-conformal fashion. This results in a thicker deposit of the edges as compared with the flat regions. As insulator material 512 is grown and coalesces over time, it results in the formation of an air-gap 102.

Figure 6:
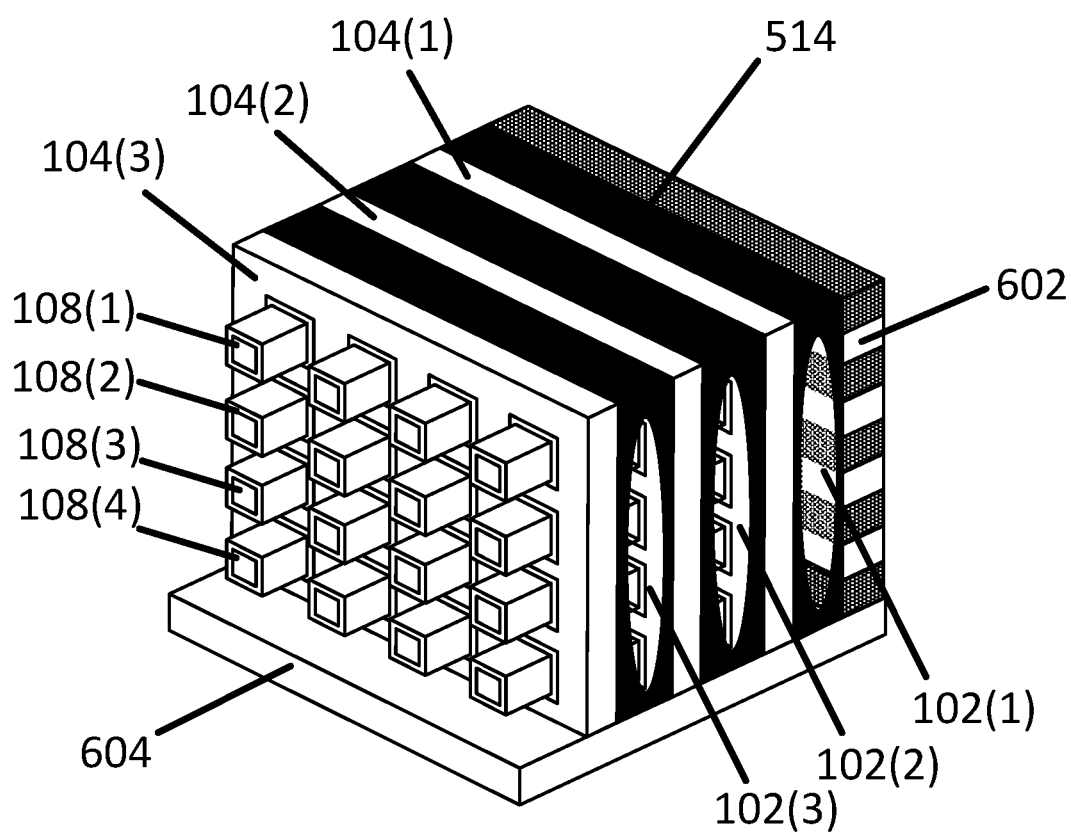
FIG. 6 shows a 3D memory structure incorporating vertical word lines that have air-gaps therebetween according to one embodiment of the present disclosure.

FIG. 6 shows a 3D memory structure incorporating vertical word lines that have air-gaps therebetween according to one embodiment of the present disclosure. As can be seen, 3D memory structure includes vertical WLs 104(1)-104(3), horizontal BLs 108(1)-108(3), first insulator material/layer 602, and second insulator material/layer 604. The previous relevant discussion is equally applicable here. However, according to one embodiment of the present disclosure, first insulator material 602 and second insulator material 604 are SiOCN that may utilize a different composition ratio than insulation material 512. In particular, by varying the chemical composition the etch resistance of the thin films and/or the deposition characteristics of the films may be engineered to enable the integration of the air-gap process. As can be further seen, insulator material 512 between vertical WLs 104(1)-104(3) include air-gaps 102(1)-102(3), according to an embodiment. Note not all insulator material 512 need to have an air-gap; in other embodiments, only select ones of insulator material 512 have air-gaps, as is also the case with a memory structure having horizontal WLs.

Figure 7:
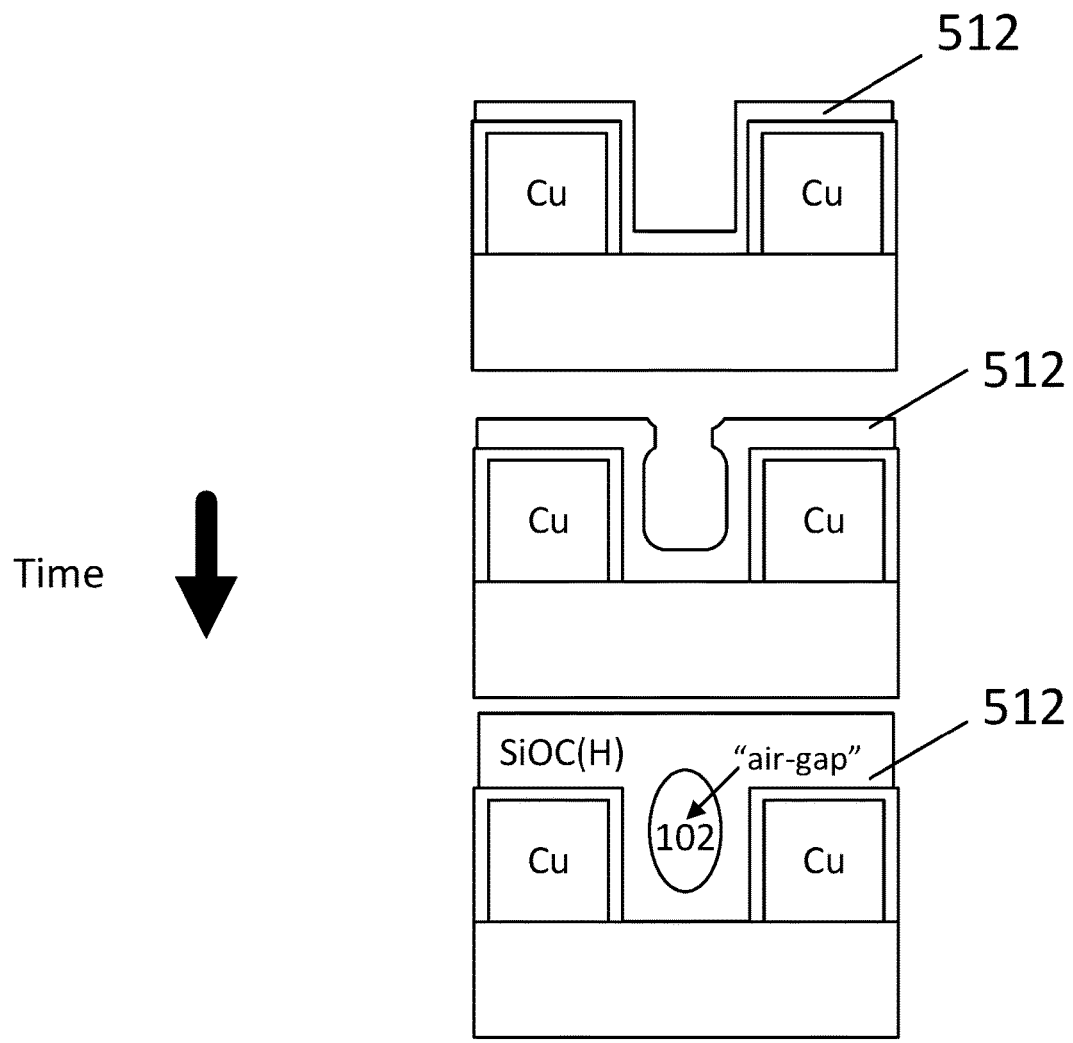
FIG. 7 illustrates a timed process flow for fabricating an air-gap according to one embodiment of the present disclosure.

FIG. 7 illustrates a timed process flow for fabricating an air-gap according to one embodiment of the present disclosure. For purposes of discussion, for example, assume that the copper (Cu) bodies are vertical WLs (as shown in FIG. 6) or horizontal WLs (as shown in FIGS. 5a-c). The underlying layer can be, for example, a select gate line. Note that the copper bodies have a barrier layer thereon (e.g., tantalum nitride) to prevent electromigration of copper into the insulator material 512. As previously indicated, the insulator material 512 can be any insulator material that can be non-conformally deposited. According to one embodiment, an alloy composition of SiOCN is used for insulator material 512. In any such cases, insulator material 512 is deposited in a non-conformal manner which results in air-gap 102 formation over time. Note that time flows from top to bottom in FIG. 7. Further note that the bottom of the trench being filled can be etched back, while the top of the trench continues to pinch-off. Once the air-gap 102 forms the deposition process is terminated. The duration of the time deposition will vary from one embodiment to the next, depending on factors such as trench size and deposition rates, as will be appreciated. According to one embodiment, etch times for air-gap 102 formation are in the range of 5-15 minutes, but in other embodiments may be 60 minutes or more.

The size of the air-gaps can vary from embodiment to embodiment, but in some cases have sidewalls that are 1 nm or wider (in the lateral or horizontal direction) and 1 nm or taller (in the vertical direction). In some example cases, at least one sidewall of a given air-gap is at least 2 nm wide and/or tall. In some example cases, at least one sidewall of a given air-gap is at least 3 nm wide and/or tall. In some example cases, at least one sidewall of a given air-gap is at least 4 nm wide and/or tall. In some example cases, at least one sidewall of a given air-gap is at least 5 nm wide and/or tall. In some example cases, at least one sidewall of a given air-gap is at least 6 nm wide and/or tall. In some example cases, at least one sidewall of a given air-gap is at least 7 nm wide and/or tall. In some example cases, at least one sidewall of a given air-gap is at least 8 nm wide and/or tall. In some example cases, at least one sidewall of a given air-gap is at least 9 nm wide and/or tall. In some example cases, at least one sidewall of a given air-gap is at least 10 nm wide and/or tall. In a more general sense, the purposefully formed air-gap can be any size, as will be appreciated, and depending on the nature of the timed deposition process utilized to provide the air-gap.

As will be further appreciated in light of this disclosure, air-gaps between horizontal WLs may be wider (in the horizontal direction) than they are tall (in the vertical direction), while air-gaps between vertical WLs may be taller (in the vertical direction) than they are wide (in the horizontal direction). For instance, air-gaps between horizontal WLs may be two or more times wider than they are tall (such as 3×, or 4×, or 5×, or 6×, or 7×, or 8×, or 9× wider), while air-gaps between vertical WLs may be two or more times taller than they are wide (such as 3×, or 4×, or 5×, or 6×, or 7×, or 8×, or 9× taller).

Figure 8:
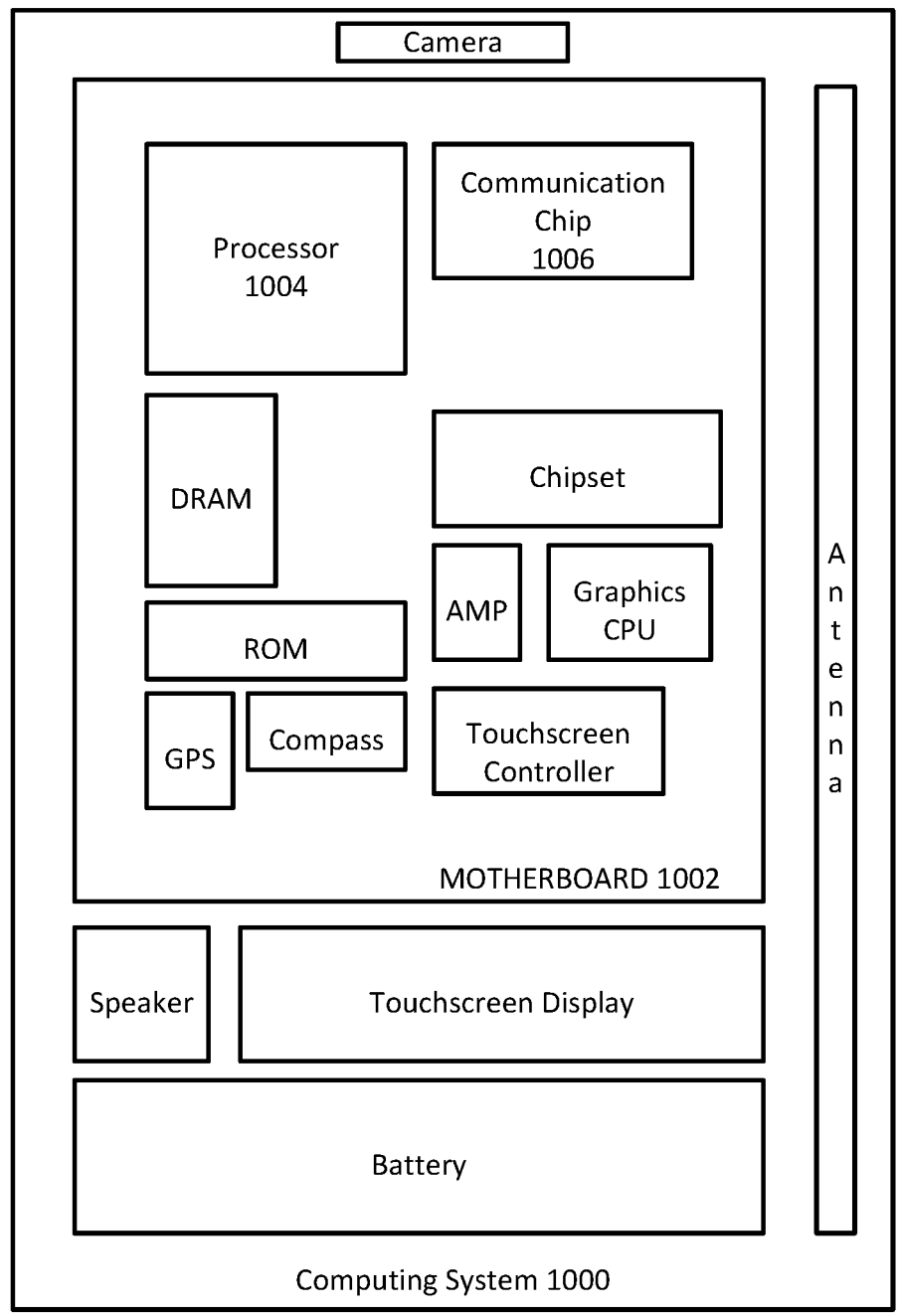
FIG. 8 illustrates a computing system implemented with integrated circuit structures formed using the techniques disclosed herein, in accordance with some embodiments of the present disclosure.

FIG. 8 illustrates a computing system implemented with integrated circuit structures and/or transistor devices formed using the techniques disclosed herein, in accordance with some embodiments of the present disclosure. Computing system 1000 may employ a number of 3D FeFET/RRAM 100 structures as described herein. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more memory structures configured in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit memory structures configured as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit memory structures configured as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit memory structures formed using the disclosed techniques, as variously described herein. Note that reference to a computing system is intended to include computing devices, apparatuses, and other structures configured for computing or processing information.

The foregoing description of example embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

Further Example Embodiments

The following examples pertain to further embodiments, from which numerous permutations and configurations will be apparent.

Example 1 is an integrated circuit, comprising a plurality of word lines (WLs), wherein said WLs are arranged in a stacked configuration with respect to one another, one or more air-gaps arranged between at least some of said WLs, a plurality of bit lines (BLs), wherein one or more said BLs intersects one or more said WLs, and an array of memory cells, at least some of the memory cells being addressable by corresponding ones of said WLs and BLs.

Example 2 includes the subject matter of Example 1 wherein the array of memory cells includes an RRAM ("Resistance Random Access Memory) memory configuration.

Example 3 includes the subject matter of Example 1 or 2, wherein the array of memory cells includes a FeFET ("Ferroelectric Field Effect Transistor") memory configuration.

Example 4 includes the subject matter of Example 1, 2 or 3, wherein said WLs are arranged parallel to an underlying wafer surface or substrate surface.

Example 5 includes the subject matter of any of the preceding Examples, wherein said WLs are arranged perpendicular to an underlying wafer surface or substrate surface.

Example 6 includes the subject matter of any of the preceding Examples, wherein each memory cell comprises a selector, a metal electrode, and an RRAM switching layer.

Example 7 includes the subject matter of Example 6, wherein said RRAM switching layer comprises oxygen and one or more of hafnium, tantalum, silicon, and tungsten.

Example 8 includes the subject matter of any of the preceding Examples, wherein said integrated circuit is a processor or a communication chip.

Example 9 includes the subject matter of any of the preceding Examples, wherein said integrated circuit is part of a mobile computing device.

Example 10 is an integrated circuit, comprising a first word line (WL) and a second WL, an air-gap between the first WL and second WL, a memory cell including a switching layer including an oxide material, a selector layer, for causing a change of state of said RRAM switching material, and a metal electrode layer, and a bit line (BL).

Example 11 includes the subject matter of Example 10, wherein said first and second WLs each comprises one of titanium and nitrogen, or tungsten, or tantalum and nitrogen, or ruthenium.

Example 12 includes the subject matter of Example 10 or 11, wherein said BL comprises one of titanium and nitrogen, or tungsten, or tantalum and nitrogen, or ruthenium.

Example 13 includes the subject matter of Example 10, 11 or 12, wherein said selector layer comprises one or more of oxygen, niobium, germanium, tellurium, and silicon.

Example 14 includes the subject matter of Example 10, 11, 12 or 13, wherein said RRAM switching layer comprises oxygen and one or more of hafnium, tantalum, silicon, and tungsten.

Example 15 includes the subject matter of Example 10, 11, 12 13 or 14, wherein said first and second WLs are arranged parallel to an underlying wafer surface or substrate surface.

Example 16 includes the subject matter of Example 10, 11, 12, 13, 14 or 15, wherein said first and second WLs are arranged perpendicular to an underlying wafer surface or substrate surface.

Example 17 includes the subject matter of Example 10, 11, 12, 13, 14, 15, or 16, wherein said integrated circuit is a processor or a communication chip.

Example 18 includes the subject matter of Example 10, 11, 12, 13, 14, 15, 16, or 17, wherein said integrated circuit is part of a mobile computing device.

Example 19 is a method for fabricating an integrated circuit, the method comprising removing a sacrificial layer in a stack of layers, the stack including first and second word line (WL) layers on opposing sides of the sacrificial layer, thereby creating a void, and non-conformally depositing an insulator layer into said void to create an air-gap between said first and second WL layers.

Example 20 includes the subject matter of Example 19, wherein prior to removing said sacrificial layer, the method further comprises depositing said first and second WL layers and said sacrificial layer in an alternating arrangement to form said stack, etching a first trench into said stack, laterally recessing etch said first and second WL layers, thereby forming one or more lateral extensions from said first trench, conformally depositing a selector layer into said first trench, including into said lateral extensions of said first trench, depositing a metal electrode layer onto said selector layer and to fill remainder of said first trench, etching to remove a portion of said metal electrode layer to create a second trench, and depositing a switching layer and a bit line (BL) layer into said second trench.

What is claimed is:

1. An integrated circuit, comprising:
   a plurality of word lines (WLs), wherein said WLs are arranged in a stacked configuration with respect to one another;
   one or more air-gaps arranged between at least some of said WLs, wherein each of the one or more air gaps is completely surrounded by a continuous insulator material;
   a plurality of bit lines (BLs), wherein one or more said BLs intersects one or more said WLs; and
   an array of memory cells, at least some of the memory cells being addressable by corresponding ones of said WLs and BLs, wherein each memory cell comprises a selector and a metal electrode, and wherein the selector is along a top, along a side, and along a bottom of the metal electrode.

2. The integrated circuit according to claim 1, wherein the array of memory cells includes an RRAM ("Resistance Random Access Memory) memory configuration.

3. The integrated circuit according to claim 1, wherein the array of memory cells includes a FeFET ("Ferroelectric Field Effect Transistor") memory configuration.

4. The integrated circuit according to claim 1, wherein said WLs are arranged parallel to an underlying wafer surface or substrate surface.

5. The integrated circuit according to claim 1, wherein said WLs are arranged perpendicular to an underlying wafer surface or substrate surface.

6. The integrated circuit according to claim 1, wherein each memory cell further comprises an RRAM switching layer.

7. The integrated circuit according to claim 6, wherein said RRAM switching layer comprises oxygen and a species selected from the group consisting of hafnium, tantalum, silicon, and tungsten.

8. The integrated circuit according to claim 1, wherein said integrated circuit is a processor or a communication chip.

9. The integrated circuit according to claim 1, wherein said integrated circuit is part of a mobile computing device.

10. An integrated circuit, comprising:
    a first word line (WL) and a second WL;
    an air-gap between the first WL and second WL, the air gap completely surrounded by a continuous insulator material;
    a memory cell including a switching layer including an oxide material, a selector layer, for causing a change of state of said RRAM switching material, and a metal electrode layer, wherein the selector layer is along a top, along a side, and along a bottom of the metal electrode layer; and
    a bit line (BL).

11. The integrated circuit according to claim 10, wherein said first and second WLs each include a composition selected from the group consisting of titanium and nitrogen, tungsten, tantalum and nitrogen, and ruthenium.

12. The integrated circuit according to claim 10, wherein said BL include a composition selected from the group consisting of titanium and nitrogen, tungsten, tantalum and nitrogen, and ruthenium.

13. The integrated circuit according to claim 10, wherein said selector layer comprises a species selected from the group consisting of oxygen, niobium, germanium, tellurium, and silicon.

14. The integrated circuit according to claim 10, wherein said RRAM switching layer comprises oxygen and a species selected from the group consisting of hafnium, tantalum, silicon, and tungsten.

15. The integrated circuit according to claim 10, wherein said first and second WLs are arranged parallel to an underlying wafer surface or substrate surface.

16. The integrated circuit according to claim 10, wherein said first and second WLs are arranged perpendicular to an underlying wafer surface or substrate surface.

17. The integrated circuit according to claim 10, wherein said integrated circuit is a processor or a communication chip.

18. The integrated circuit according to claim 10, wherein said integrated circuit is part of a mobile computing device.

19. A method for fabricating an integrated circuit, the method comprising:
   removing a sacrificial layer in a stack of layers, the stack including an array of memory cells, wherein each memory cell comprises a selector layer and a metal electrode layer, and wherein the selector layer is along a top, along a side, and along a bottom of the metal electrode layer, and the stack including first and second word line (WL) layers on opposing sides of the sacrificial layer, thereby creating a void; and
   non-conformally depositing an insulator layer into said void to create an air-gap between said first and second WL layers, the air gap completely surrounded by a continuous insulator material.

20. The method according to claim 19, wherein prior to removing said sacrificial layer, the method further comprises:
   depositing said first and second WL layers and said sacrificial layer in an alternating arrangement to form said stack;
   etching a first trench into said stack;
   laterally recessing etch said first and second WL layers, thereby forming one or more lateral extensions from said first trench;
   conformally depositing the selector layer into said first trench, including into said lateral extensions of said first trench;
   depositing the metal electrode layer onto said selector layer and to fill remainder of said first trench;
   etching to remove a portion of said metal electrode layer to create a second trench; and
   depositing a switching layer and a bit line (BL) layer into said second trench.

* * * * *